(12) United States Patent
Pham et al.

(10) Patent No.: US 8,446,791 B2
(45) Date of Patent: May 21, 2013

(54) PROCESS TOLERANT LARGE-SWING SENSE AMPLFIER WITH LATCHING CAPABILITY

(75) Inventors: Ha M. Pham, Milpitas, CA (US);
Jin-Uk Shin, San Jose, CA (US);
Vaibhav Gupta, Santa Clara, CA (US)

(73) Assignee: Oracle International Corporation, Redwood Shores, CA (US)

( * ) Notice: Subject to any disclaimer, the term of this patent is extended or adjusted under 35 U.S.C. 154(b) by 242 days.

(21) Appl. No.: 12/960,047

(22) Filed: Dec. 3, 2010

(65) Prior Publication Data

US 2012/0140575 A1 Jun. 7, 2012

(51) Int. Cl.
*G11C 7/06* (2006.01)
*G11C 7/08* (2006.01)
*G11C 7/12* (2006.01)
*G11C 7/22* (2006.01)
*G11C 8/12* (2006.01)

(52) U.S. Cl.
USPC . 365/207; 365/189.15; 365/203; 365/189.07; 365/206; 365/190; 365/205; 365/230.03; 365/189.14; 365/189.16

(58) Field of Classification Search
USPC .............. 365/189.07, 189.15, 203, 205, 207, 365/206, 154, 156, 190, 189.14, 189.16, 365/230.03
See application file for complete search history.

(56) References Cited

U.S. PATENT DOCUMENTS

| | | | | |
|---|---|---|---|---|
| 5,604,705 | A * | 2/1997 | Ackland et al. | 365/205 |
| 5,959,916 | A * | 9/1999 | Kumar | 365/203 |
| 5,986,942 | A * | 11/1999 | Sugibayashi | 365/189.011 |
| 6,049,493 | A * | 4/2000 | Kitamoto et al. | 365/203 |
| 6,104,653 | A * | 8/2000 | Proebsting | 365/203 |
| 6,323,698 | B1 * | 11/2001 | Fletcher | 327/100 |
| 2006/0092711 | A1 * | 5/2006 | Kant et al. | 365/189.01 |
| 2007/0104005 | A1 * | 5/2007 | Bowyer et al. | 365/207 |
| 2009/0109772 | A1 * | 4/2009 | Terzioglu et al. | 365/194 |
| 2010/0302837 | A1 * | 12/2010 | Zhang et al. | 365/154 |

* cited by examiner

*Primary Examiner* — J. H. Hur
(74) *Attorney, Agent, or Firm* — Osha Liang LLP

(57) ABSTRACT

A process-tolerant large-swing sense amplifier with latching capability includes top-array and bottom-array access. The sense amplifier provides improved tolerance to process variation, reduces design complexity, reduces power consumption, and reduces the physical footprint of the circuit. In addition, the sense amplifier provides write-through functionality through the read data bus.

19 Claims, 2 Drawing Sheets

PROCESS TOLERANT LARGE-SWING SENSE AMPLFIER WITH LATCHING CAPABILITY

BACKGROUND OF INVENTION

Semiconductor devices are typically subject to process, voltage, and temperature ("PVT") variations. Process variation relates to variation due to the semiconductor fabrication process. Voltage variation relates to variation from ideal values of one or more supply voltages. Temperature variation relates to variation from an operating temperature or an operating temperature range.

A semiconductor processor includes one or more processing cores and one or more cache memory arrays comprised of Static Random Access Memory ("SRAM"). Because of the size of the SRAM arrays, each SRAM cell typically has a small-swing with respect to voltage. Sense amplifiers are used to amplify the voltage so that a value stored in a memory cell can be read out. As device geometries continue to shrink with each process generation, PVT variations impact small-swing sense amplifier designs. Conventional small-swing sense amplifiers require precise timing of the control signals to provide margin in anticipation of PVT variations.

SUMMARY OF INVENTION

According to one aspect of one or more embodiments of the present invention, a sense amplifier includes a top-array multiplexer wherein the top-array multiplexer is configured to input a top-array bit-line signal to a first top-array column select node and to input a top-array bit-line complement signal to a second top-array column select node. The sense amplifier includes a first top-array pre-charge PMOS transistor wherein a source of the first top-array pre-charge PMOS transistor is connected to a voltage supply, a drain of the first top-array pre-charge PMOS transistor is connected to the first top-array column select node, and a gate of the first top-array pre-charge PMOS transistor is configured to receive a top-array pre-charge signal. The sense amplifier includes a second top-array pre-charge PMOS transistor wherein a source of the second top-array pre-charge PMOS transistor is connected to the voltage supply, a drain of the second top-array pre-charge PMOS transistor is connected to the second top-array column select node, and a gate of the second top-array pre-charge PMOS transistor is configured to receive the top-array pre-charge signal. The sense amplifier includes a first top-array write-date NMOS transistor wherein a drain of the first top-array write-data NMOS transistor is connected to the first top-array column select node, a source of the first top-array write-data NMOS transistor is connected to a ground voltage, and a gate of the first top-array write-data NMOS transistor is configured to receive a top-array write-data signal. The sense amplifier includes a second top-array write-date NMOS transistor wherein a drain of the second top-array write-data NMOS transistor is connected to the second top-array column select node, a source of the second top-array write-data NMOS transistor is connected to the ground voltage, and a gate of the second top-array write-data NMOS transistor is configured to receive a top-array write-data complement signal. The sense amplifier includes a first top-array sensing PMOS transistor wherein a source of the first top-array sensing PMOS transistor is connected to the voltage supply, a drain of the first top-array sensing PMOS transistor is connected to a first inverter gating node, and a gate of the first top-array sensing PMOS transistor is connected to the first top-array column select node. The sense amplifier includes a second top-array sensing PMOS transistor wherein a source of the second top-array sensing PMOS transistor is connected to the voltage supply, a drain of the second top-array sensing PMOS transistor is connected to a second inverter gating node, and a gate of the second top-array sensing PMOS transistor is connected to the second top-array column select node. The sense amplifier includes a sense latch. The sense latch includes a first inverter comprised of a PMOS transistor and an NMOS transistor, wherein a source of the PMOS transistor is connected to the voltage supply, a drain of the PMOS transistor is connected to a source of the NMOS transistor and the second inverter gating node, and a gate of the PMOS transistor is connected to the first inverter gating node, and wherein a drain of the NMOS transistor is connected a source of a first NMOS transistor of a first NMOS transistor stack, and a gate of the NMOS transistor is connected to the first inverter gating node. The sense latch includes a second inverter comprised of a PMOS transistor and an NMOS transistor, wherein a source of the PMOS transistor is connected to the voltage supply, a drain of the PMOS transistor is connected to a source of the NMOS transistor and the first inverter gating node, and a gate of the PMOS transistor is connected to the first inverter gating node, and wherein a drain of the NMOS transistor is connected a drain of a first NMOS transistor of a second NMOS transistor stack, and a gate of the NMOS transistor is connected to the second inverter gating node. The first NMOS stack includes the first NMOS transistor and a second NMOS transistor, wherein a drain of the first NMOS transistor is connected to a source of the second NMOS transistor, and a gate of the first NMOS transistor is connected to the second top-array column select node, and wherein a drain of the second NMOS transistor is connected to the ground voltage, a gate of the second NMOS transistor is connected to a second bottom-array column select node, the second NMOS stack comprises the first NMOS transistor and a second NMOS transistor, wherein a drain of the first NMOS transistor is connected to a source of the second NMOS transistor, and a gate of the first NMOS transistor is connected to the first top-array column select node, and wherein a drain of the second NMOS transistor is connected to the ground voltage, a gate of the second NMOS transistor is connected to a first bottom-array column select node. The sense amplifier includes a bottom-array multiplexer wherein the bottom-array multiplexer is configured to input a bottom-array bit-line signal to a first bottom-array column select node and to input a bottom-array bit-line complement signal to a second bottom-array column select node. The sense amplifier includes a first bottom-array pre-charge PMOS transistor wherein a source of the first bottom-array pre-charge PMOS transistor is connected to the voltage supply, a drain of the first bottom-array pre-charge PMOS transistor is connected to the first bottom-array column select node, and a gate of the first bottom-array pre-charge PMOS transistor is configured to receive a bottom-array pre-charge signal. The sense amplifier includes a second bottom-array pre-charge PMOS transistor wherein a source of the second bottom-array pre-charge PMOS transistor is connected to the voltage supply, a drain of the second bottom-array pre-charge PMOS transistor is connected to the second bottom-array column select node, and a gate of the second bottom-array pre-charge PMOS transistor is configured to receive the bottom-array pre-charge signal. The sense amplifier includes a first bottom-array write-date NMOS transistor wherein a drain of the first bottom-array write-data NMOS transistor is connected to the first bottom-array column select node, a source of the first bottom-array write-data NMOS transistor is connected to a ground voltage, and a gate of the first bottom-array write-data NMOS transistor is configured to receive a bottom-array write-data signal. The sense amplifier includes a second bottom-array write-date NMOS transistor wherein a drain of the second bottom-array write-data NMOS transistor is connected to the second bottom-array column select node, a source of the second bottom-array write-data NMOS transistor is connected to the ground voltage, and a gate of the second bottom-array write-data NMOS transistor is configured to receive a bottom-array write-data complement signal. The sense amplifier includes a first bottom-array sensing PMOS transistor wherein a source of the first bottom-array sensing PMOS transistor is connected to the voltage supply, a drain of the first bottom-array sensing PMOS transistor is connected to the first inverter gating node, and a gate of the first bottom-array sensing PMOS transistor is connected to the first bottom-array column select node. The sense amplifier includes a second bottom-array sensing PMOS transistor wherein a source of the second bottom-array sensing PMOS transistor is connected to the voltage supply, a drain of the second top-array sensing PMOS transistor is connected to the second inverter gating node, and a gate of the second bottom-array sensing PMOS transistor is connected to the second bottom-array column select node. The second inverter gating node is configured to output the data value stored in the sense latch.

According to one aspect of one or more embodiments of the present invention, a processor core is coupled to a cache memory. The cache memory includes a plurality of sense amplifiers. Each sense amplifier includes a top-array multiplexer wherein the top-array multiplexer is configured to input a top-array bit-line signal to a first top-array column select node and to input a top-array bit-line complement signal to a second top-array column select node. The sense amplifier includes a first top-array pre-charge PMOS transistor wherein a source of the first top-array pre-charge PMOS transistor is connected to a voltage supply, a drain of the first top-array pre-charge PMOS transistor is connected to the first top-array column select node, and a gate of the first top-array pre-charge PMOS transistor is configured to receive a top-array pre-charge signal. The sense amplifier includes a second top-array pre-charge PMOS transistor wherein a source of the second top-array pre-charge PMOS transistor is connected to the voltage supply, a drain of the second top-array pre-charge PMOS transistor is connected to the second top-array column select node, and a gate of the second top-array pre-charge PMOS transistor is configured to receive the top-array pre-charge signal. The sense amplifier includes a first top-array write-date NMOS transistor wherein a drain of the first top-array write-data NMOS transistor is connected to the first top-array column select node, a source of the first top-array write-data NMOS transistor is connected to a ground voltage, and a gate of the first top-array write-data NMOS transistor is configured to receive a top-array write-data signal. The sense amplifier includes a second top-array write-date NMOS transistor wherein a drain of the second top-array write-data NMOS transistor is connected to the second top-array column select node, a source of the second top-array write-data NMOS transistor is connected to the ground voltage, and a gate of the second top-array write-data NMOS transistor is configured to receive a top-array write-data complement signal. The sense amplifier includes a first top-array sensing PMOS transistor wherein a source of the first top-array sensing PMOS transistor is connected to the voltage supply, a drain of the first top-array sensing PMOS transistor is connected to a first inverter gating node, and a gate of the first top-array sensing PMOS transistor is connected to the first top-array column select node. The sense amplifier includes a second top-array sensing PMOS transistor wherein a source of the second top-array sensing PMOS transistor is connected to the voltage supply, a drain of the second top-array sensing PMOS transistor is connected to a second inverter gating node, and a gate of the second top-array sensing PMOS transistor is connected to the second top-array column select node. The sense amplifier includes a sense latch. The sense latch includes a first inverter comprised of a PMOS transistor and an NMOS transistor, wherein a source of the PMOS transistor is connected to the voltage supply, a drain of the PMOS transistor is connected to a source of the NMOS transistor and the second inverter gating node, and a gate of the PMOS transistor is connected to the first inverter gating node, and wherein a drain of the NMOS transistor is connected a source of a first NMOS transistor of a first NMOS transistor stack, and a gate of the NMOS transistor is connected to the first inverter gating node. The sense latch includes a second inverter comprised of a PMOS transistor and an NMOS transistor, wherein a source of the PMOS transistor is connected to the voltage supply, a drain of the PMOS transistor is connected to a source of the NMOS transistor and the first inverter gating node, and a gate of the PMOS transistor is connected to the first inverter gating node, and wherein a drain of the NMOS transistor is connected a drain of a first NMOS transistor of a second NMOS transistor stack, and a gate of the NMOS transistor is connected to the second inverter gating node. The first NMOS stack includes the first NMOS transistor and a second NMOS transistor, wherein a drain of the first NMOS transistor is connected to a source of the second NMOS transistor, and a gate of the first NMOS transistor is connected to the second top-array column select node, and wherein a drain of the second NMOS transistor is connected to the ground voltage, a gate of the second NMOS transistor is connected to a second bottom-array column select node, the second NMOS stack comprises the first NMOS transistor and a second NMOS transistor, wherein a drain of the first NMOS transistor is connected to a source of the second NMOS transistor, and a gate of the first NMOS transistor is connected to the first top-array column select node, and wherein a drain of the second NMOS transistor is connected to the ground voltage, a gate of the second NMOS transistor is connected to a first bottom-array column select node. The sense amplifier includes a bottom-array multiplexer wherein the bottom-array multiplexer is configured to input a bottom-array bit-line signal to a first bottom-array column select node and to input a bottom-array bit-line complement signal to a second bottom-array column select node. The sense amplifier includes a first bottom-array pre-charge PMOS transistor wherein a source of the first bottom-array pre-charge PMOS transistor is connected to the voltage supply, a drain of the first bottom-array pre-charge PMOS transistor is connected to the first bottom-array column select node, and a gate of the first bottom-array pre-charge PMOS transistor is configured to receive a bottom-array pre-charge signal. The sense amplifier includes a second bottom-array pre-charge PMOS transistor wherein a source of the second bottom-array pre-charge PMOS transistor is connected to the voltage supply, a drain of the second bottom-array pre-charge PMOS transistor is connected to the second bottom-array column select node, and a gate of the second bottom-array pre-charge PMOS transistor is configured to receive the bottom-array pre-charge signal. The sense amplifier includes a first bottom-array write-date NMOS transistor wherein a drain of the first bottom-array write-data NMOS transistor is connected to the first bottom-array column select node, a source of the first bottom-array write-data NMOS transistor is connected to a ground voltage, and a gate of the first bottom-array write-data NMOS transistor is configured to receive a bottom-array write-data signal. The sense amplifier includes a second bottom-array write-date NMOS transistor wherein a drain of the second bottom-array write-data NMOS transistor is connected to the second bottom-array column select node, a source of the second bottom-array write-data NMOS transistor is connected to the ground voltage, and a gate of the second bottom-array write-data NMOS transistor is configured to receive a bottom-array write-data complement signal. The sense amplifier includes a first bottom-array sensing PMOS transistor wherein a source of the first bottom-array sensing PMOS transistor is connected to the voltage supply, a drain of the first bottom-array sensing PMOS transistor is connected to the first inverter gating node, and a gate of the first bottom-array sensing PMOS transistor is connected to the first bottom-array column select node. The sense amplifier includes a second bottom-array sensing PMOS transistor wherein a source of the second bottom-array sensing PMOS transistor is connected to the voltage supply, a drain of the second top-array sensing PMOS transistor is connected to the second inverter gating node, and a gate of the second bottom-array sensing PMOS transistor is connected to the second bottom-array column select node. The second inverter gating node is configured to output the data value stored in the sense latch.

According to one aspect of one or more embodiments of the present invention, a system includes an input device, an output device, a printed circuit board, and a processor disposed on the printed circuit board. The processor is coupled to a cache memory. The cache memory includes a plurality of sense amplifiers. Each sense amplifier includes a top-array multiplexer wherein the top-array multiplexer is configured to input a top-array bit-line signal to a first top-array column select node and to input a top-array bit-line complement signal to a second top-array column select node. The sense amplifier includes a first top-array pre-charge PMOS transistor wherein a source of the first top-array pre-charge PMOS transistor is connected to a voltage supply, a drain of the first top-array pre-charge PMOS transistor is connected to the first top-array column select node, and a gate of the first top-array pre-charge PMOS transistor is configured to receive a top-array pre-charge signal. The sense amplifier includes a second top-array pre-charge PMOS transistor wherein a source of the second top-array pre-charge PMOS transistor is connected to the voltage supply, a drain of the second top-array pre-charge PMOS transistor is connected to the second top-array column select node, and a gate of the second top-array pre-charge PMOS transistor is configured to receive the top-array pre-charge signal. The sense amplifier includes a first top-array write-date NMOS transistor wherein a drain of the first top-array write-data NMOS transistor is connected to the first top-array column select node, a source of the first top-array write-data NMOS transistor is connected to a ground voltage, and a gate of the first top-array write-data NMOS transistor is configured to receive a top-array write-data signal. The sense amplifier includes a second top-array write-date NMOS transistor wherein a drain of the second top-array write-data NMOS transistor is connected to the second top-array column select node, a source of the second top-array write-data NMOS transistor is connected to the ground voltage, and a gate of the second top-array write-data NMOS transistor is configured to receive a top-array write-data complement signal. The sense amplifier includes a first top-array sensing PMOS transistor wherein a source of the first top-array sensing PMOS transistor is connected to the voltage supply, a drain of the first top-array sensing PMOS transistor is connected to a first inverter gating node, and a gate of the first top-array sensing PMOS transistor is connected to the first top-array column select node. The sense amplifier includes a second top-array sensing PMOS transistor wherein a source of the second top-array sensing PMOS transistor is connected to the voltage supply, a drain of the second top-array sensing PMOS transistor is connected to a second inverter gating node, and a gate of the second top-array sensing PMOS transistor is connected to the second top-array column select node. The sense amplifier includes a sense latch. The sense latch includes a first inverter comprised of a PMOS transistor and an NMOS transistor, wherein a source of the PMOS transistor is connected to the voltage supply, a drain of the PMOS transistor is connected to a source of the NMOS transistor and the second inverter gating node, and a gate of the PMOS transistor is connected to the first inverter gating node, and wherein a drain of the NMOS transistor is connected a source of a first NMOS transistor of a first NMOS transistor stack, and a gate of the NMOS transistor is connected to the first inverter gating node. The sense latch includes a second inverter comprised of a PMOS transistor and an NMOS transistor, wherein a source of the PMOS transistor is connected to the voltage supply, a drain of the PMOS transistor is connected to a source of the NMOS transistor and the first inverter gating node, and a gate of the PMOS transistor is connected to the first inverter gating node, and wherein a drain of the NMOS transistor is connected a drain of a first NMOS transistor of a second NMOS transistor stack, and a gate of the NMOS transistor is connected to the second inverter gating node. The first NMOS stack includes the first NMOS transistor and a second NMOS transistor, wherein a drain of the first NMOS transistor is connected to a source of the second NMOS transistor, and a gate of the first NMOS transistor is connected to the second top-array column select node, and wherein a drain of the second NMOS transistor is connected to the ground voltage, a gate of the second NMOS transistor is connected to a second bottom-array column select node, the second NMOS stack comprises the first NMOS transistor and a second NMOS transistor, wherein a drain of the first NMOS transistor is connected to a source of the second NMOS transistor, and a gate of the first NMOS transistor is connected to the first top-array column select node, and wherein a drain of the second NMOS transistor is connected to the ground voltage, a gate of the second NMOS transistor is connected to a first bottom-array column select node. The sense amplifier includes a bottom-array multiplexer wherein the bottom-array multiplexer is configured to input a bottom-array bit-line signal to a first bottom-array column select node and to input a bottom-array bit-line complement signal to a second bottom-array column select node. The sense amplifier includes a first bottom-array pre-charge PMOS transistor wherein a source of the first bottom-array pre-charge PMOS transistor is connected to the voltage supply, a drain of the first bottom-array pre-charge PMOS transistor is connected to the first bottom-array column select node, and a gate of the first bottom-array pre-charge PMOS transistor is configured to receive a bottom-array pre-charge signal. The sense amplifier includes a second bottom-array pre-charge PMOS transistor wherein a source of the second bottom-array pre-charge PMOS transistor is connected to the voltage supply, a drain of the second bottom-array pre-charge PMOS transistor is connected to the second bottom-array column select node, and a gate of the second bottom-array pre-charge PMOS transistor is configured to receive the bottom-array pre-charge signal. The sense amplifier includes a first bottom-array write-date NMOS transistor wherein a drain of the first bottom-array write-data NMOS transistor is connected to the first bottom-array column select node, a source of the first bottom-array write-data NMOS transistor is connected to a ground voltage, and a gate of the first bottom-array write-data NMOS transistor is configured to receive a bottom-array write-data signal. The sense amplifier includes a second bottom-array write-date NMOS transistor wherein a drain of the second bottom-array write-data NMOS transistor is connected to the second bottom-array column select node, a source of the second bottom-array write-data NMOS transistor is connected to the ground voltage, and a gate of the second bottom-array write-data NMOS transistor is configured to receive a bottom-array write-data complement signal. The sense amplifier includes a first bottom-array sensing PMOS transistor wherein a source of the first bottom-array sensing PMOS transistor is connected to the voltage supply, a drain of the first bottom-array sensing PMOS transistor is connected to the first inverter gating node, and a gate of the first bottom-array sensing PMOS transistor is connected to the first bottom-array column select node. The sense amplifier includes a second bottom-array sensing PMOS transistor wherein a source of the second bottom-array sensing PMOS transistor is connected to the voltage supply, a drain of the second top-array sensing PMOS transistor is connected to the second inverter gating node, and a gate of the second bottom-array sensing PMOS transistor is connected to the second bottom-array column select node. The second inverter gating node is configured to output the data value stored in the sense latch.

According to one aspect of one or more embodiments of the present invention, a processor includes a first memory array, a second memory array, and a sense amplifier disposed between the first memory array and the second memory array. The sense amplifier includes a pre-charge circuit, a keeper circuit, a sense latch, and an output buffer. The sense amplifier is configured to amplify small signals of the first memory array and the second memory array.

Other aspects of the present invention will be apparent from the following description and the appended claims.

DETAILED DESCRIPTION

Figure 1:
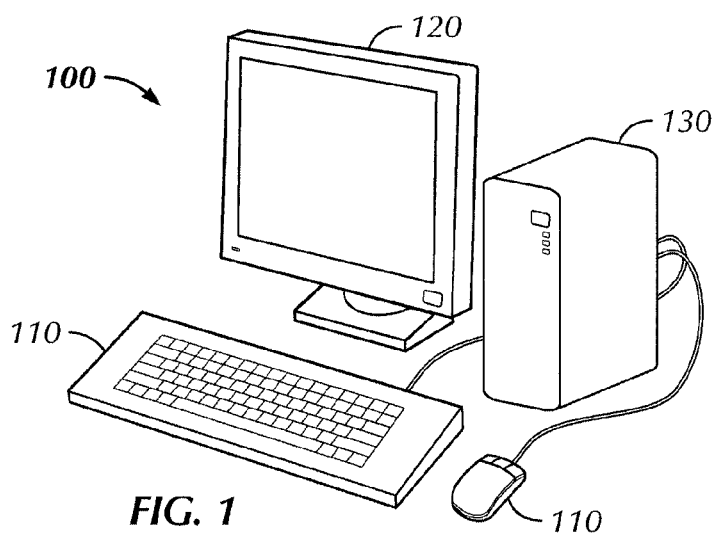
FIG. 1 shows a computing system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a computing system in accordance with one or more embodiments of the present invention. A computing system 100 includes an input device 110, an output device 120, and a mechanical chassis 130. The mechanical chassis 130 includes one or more printed circuit boards ("PCB"), a network device, and a storage device (not shown). In one or more embodiments of the present invention, the computing system 100 is a server, a workstation, a desktop computer, or a mobile computer. One of ordinary skill in the art will recognize the computing system could be any processor-based device.

Figure 2:
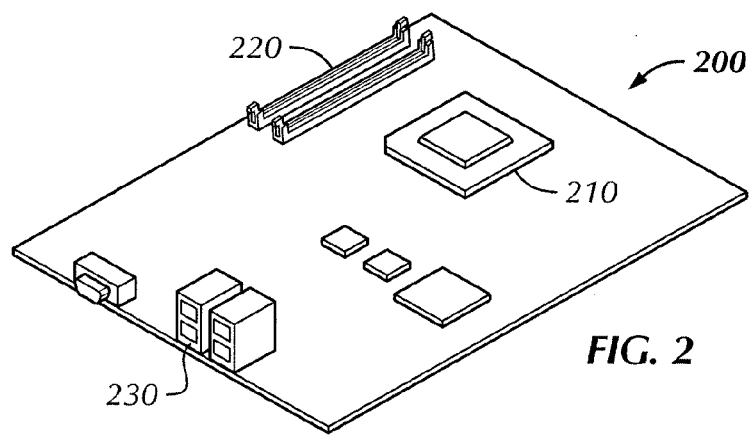
FIG. 2 shows a printed circuit board of the computing system in accordance with one or more embodiments of the present invention.

FIG. 2 shows a printed circuit board of the computing system in accordance with one or more embodiments of the present invention. A PCB 200 includes one or more processors 210, a system memory 220, and a network device 230. In one or more embodiments of the present invention the network device 230 supports the Ethernet standard. One of ordinary skill in the art will recognize that the one or more processors 210, the system memory 220, and the network device 230 may be disposed on any combination of one or more PCBs 200 as part of the computing system 100.

Figure 3:
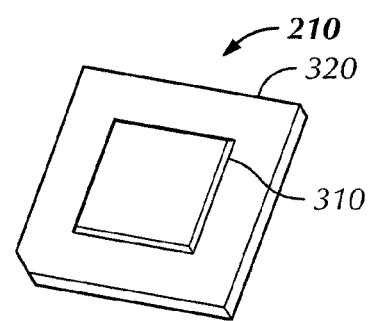
FIG. 3 shows a processor of the computing system in accordance with one or more embodiments of the present invention.

FIG. 3 shows a processor of the computing system in accordance with one or more embodiments of the present invention. Each processor 210 includes one or more die 310 disposed on a substrate 320. Each die 310 includes one or more processing cores 330 (not shown). Each processing core 330 includes one or more on-chip cache as part of a hierarchical organization of memory within the computing system 100. The on-chip cache may store instructions, data, or a combination of instructions and data. One of ordinary skill in the art will recognize that the use of on-chip cache can accelerate memory operations.

A processor 210 that consists of a single processing core is referred to a single-core processor. A single-core processor includes a private first level cache ("L1$") and a private second level cache ("L2$"). In this instance, the L1$ and L2$ are private because they are for the exclusive use of the single-core processor with respect to other processing cores. The caches are named in order of proximity to the core. In this instance, the cache closest to the core is designated the L1$. If the computing system 100 includes a plurality of single-core processors that share the system memory 220, additional hardware may be implemented within the computing system 100 to ensure coherency of the caches of each single-core processor and the system memory 220. This additional hardware may include a shared coherency hub or directory that is shared by the plurality of single-core processors.

A processor that consists of multiple processing cores is referred to as a multi-core processor. In a multi-core processor, each core includes a private L1$, a private L2$, and a third level cache ("L3$") that is shared by some or all of the processing cores that comprise the multi-core processor. In this instance, the L3$ is considered shared because it is shared by some or all of the processing cores that comprise the multi-core processor. One of ordinary skill in the art will recognize that the organization of the cache memories within a multi-core processor may vary and the above-noted organization is merely one exemplary embodiment of the many different memory organizations to which the present invention is applicable. If the computing system 100 includes a plurality of multi-core processors that share the system memory 220, additional hardware may be implemented within the computing system 100 to ensure coherency of the caches of each processor and the system memory 220. This additional hardware may include a shared coherency hub or directory that is shared by some or all of the plurality of multi-core processors.

Figure 4:
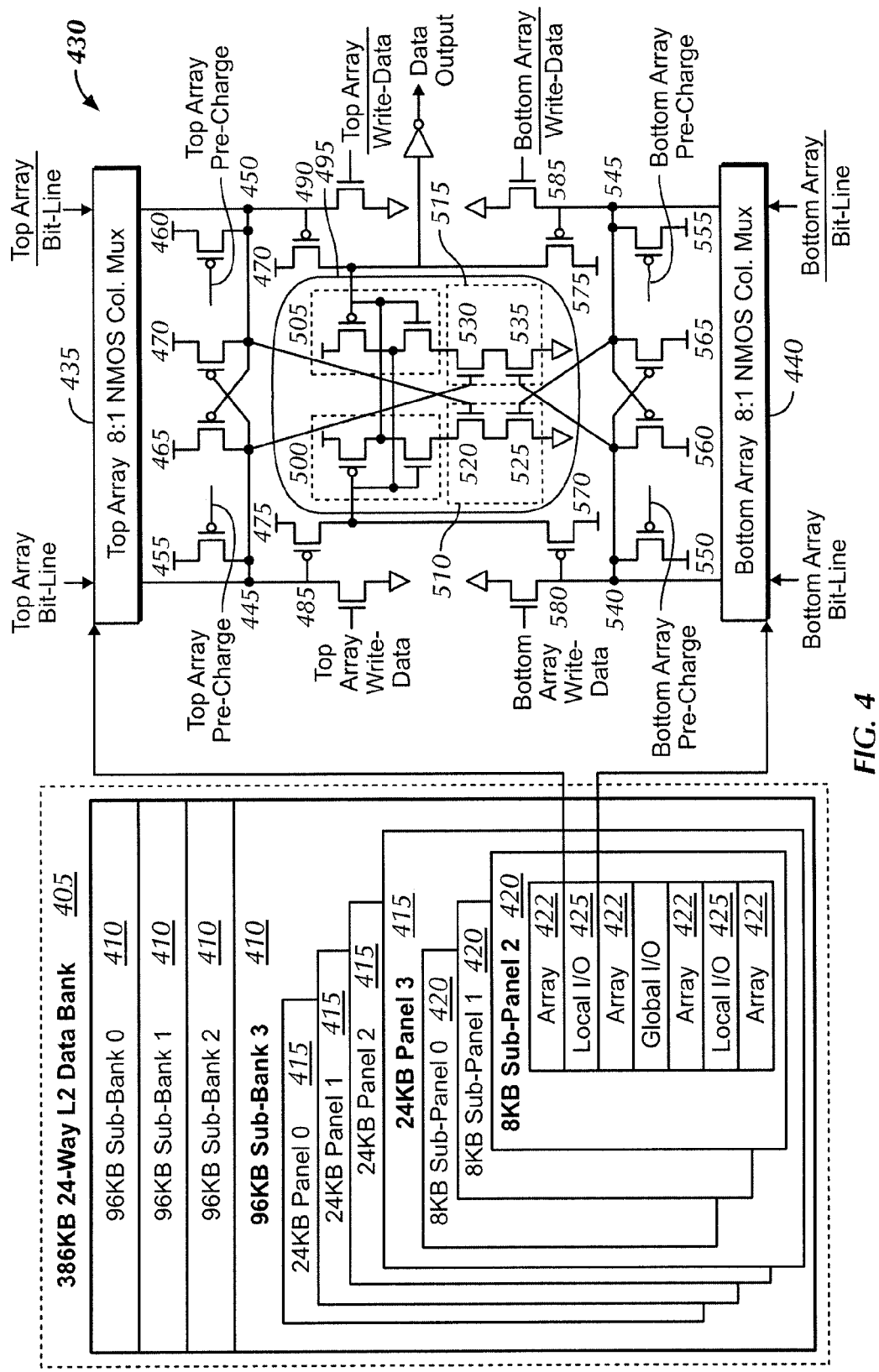
FIG. 4 shows a process-tolerant, large-swing sense amplifier in accordance with one or more embodiments of the present invention.

FIG. 4 shows a process-tolerant, large-swing sense amplifier in accordance with one or more embodiments of the present invention. In one or more embodiments of the present invention, a cache memory is organized as a 386 KB, 24-way, L2 data cache memory and includes a plurality of banks 405, plurality of sub-banks 410, a plurality of panels 415, a plurality of sub-panels 420, a plurality of memory arrays 422, and a plurality of local input/output ("IO") 425. Specifically, each bank 405 is comprised of four sub-banks 410. Each sub-bank 410 is comprised of four panels 415. Each panel 415 is comprised of three sub-panels 420. Each sub-panel 420 is comprised of a pair of memory arrays 422. Each pair of memory arrays 422 includes a top-array and a bottom-array that share a local IO 425. One of ordinary skill in the art will recognize that the organization of the cache memory may be varied in accordance with one or more embodiments of the present invention. Each local IO 425 performs input and output functions with respect to a pair of memory arrays 422. Each local IO 425 includes a plurality of sense amplifiers 430.

Sense amplifier 430 provides top-array and bottom-array access and write-through functionality. As such, sense amplifiers 430 can be placed between arrays and reduce the number of sense amplifiers required in a given design. As a result, the physical footprint and the power consumption required by the sense amplifier function is reduced. In addition, this reduces the design complexity and provides for greater process tolerance.

Sense amplifier 430 inputs a top-array column select differential pair via a top-array 8 to 1 NMOS column multiplexer 435 and inputs a bottom-array column select differential pair via a bottom-array 8 to 1 NMOS column multiplexer 440. One of ordinary skill in the art, having the benefit of this disclosure, will recognize that the multiplexers could be varied in accordance with one or more embodiments of the present invention. The top-array column select differential pair includes a top-array bit-line signal and a top-array bit-line complement signal. The bottom-array column select differential pair includes a bottom-array bit-line signal and a bottom-array bit-line complement signal. Sense amplifier 430 detects and amplifies the column select voltage to provide large-swing functionality as detailed herein.

Top-array column multiplexer 435 inputs top-array bit-line signal to top-array column select node 445 and top-array bit-line complement signal to top-array column select node 450. The drain of top-array pre-charge P-type Metal Oxide Semiconductor ("PMOS") transistor 455 is connected to top-array column select node 445 and the drain of top-array pre-charge PMOS transistor 460 is connected to top-array column select node 450, to pre-charge each respective top-array column select node. The gates of top-array pre-charge PMOS transistors 455 and 460 are driven by a top-array pre-charge signal. The source of top-array pre-charge PMOS transistor 455 is connected to a voltage supply and the source of top-array pre-charge PMOS transistor 460 is connected to the voltage supply.

The drain of top-array noise immunity PMOS transistor 465 is connected to top-array column select node 445 and the drain of top-array noise immunity PMOS transistor 470 is connected to top-array column select node 450. The source of top-array noise immunity PMOS transistor 465 is connected to the voltage supply and the source of top-array noise immunity PMOS transistor 470 is connected to the voltage supply. Top-array noise immunity PMOS transistors 465 and 470 help maintain the pre-charge voltage level at the top-array column select nodes 445 and 450 and are cross-coupled to improve noise immunity on the top-array column selects. Specifically, the gate of top-array noise immunity PMOS transistor 465 is connected to the drain of top-array noise immunity PMOS transistor 470 and the gate of top-array noise immunity PMOS transistor 470 is connected to the drain of top-array noise immunity PMOS transistor 465.

The gate of top-array sensing PMOS transistor 475 is connected to top-array column select node 445 and the gate of top-array sensing PMOS transistor 480 is connected to top-array column select node 450. The source of top-array sensing PMOS transistor 475 is connected to the voltage supply and the source of top-array sensing PMOS transistor 480 is connected to the voltage supply. The drain of top-array sensing PMOS transistor 475 is connected to a first inverter gating node and the drain of top-array sensing PMOS transistor 480 is connected to a second inverter gating node.

The drain of top-array write-data NMOS transistor 485 is connected to top-array column select node 445 and the drain of top-array write-data NMOS transistor 490 is connected to top-array column select node 450. The source of top-array write-data NMOS transistor 485 is connected to a ground voltage and the source of top-array write-data NMOS transistor 490 is connected to the ground voltage. The gate of top-array write-data NMOS transistor 485 is driven by a top-array write-data signal and the gate of top-array write-data NMOS transistor 490 is driven by a top-array write-data complement signal.

Bottom-array column multiplexer 440 inputs bottom-array bit-line signal to bottom-array column select node 540 and bottom-array bit-line complement signal to bottom-array column select node 545. The drain of bottom-array pre-charge PMOS transistor 550 is connected to bottom-array column select node 540 and the drain of bottom-array pre-charge PMOS transistor 555 is connected to bottom-array column select node 545, to pre-charge each respective bottom-array column select node. The gates of bottom-array pre-charge PMOS transistors 550 and 555 are driven by a bottom-array pre-charge signal. The source of bottom-array pre-charge transistor 550 is connected to the voltage supply and the source of bottom-array pre-charge transistor 555 is connected to the voltage supply.

The drain of bottom-array noise immunity PMOS transistor 560 is connected to bottom-array column select node 540 and the drain of bottom-array noise immunity PMOS transistor 565 is connected to bottom-array column select node 545. The source of bottom-array noise immunity PMOS transistor 560 is connected to the voltage supply and the source of bottom-array noise immunity PMOS transistor 565 is connected to the voltage supply. Bottom-array noise immunity PMOS transistors 560 and 565 help maintain the pre-charge voltage level at the bottom-array column select nodes 540 and 545 and are cross-coupled to improve noise immunity on the bottom-array column selects. Specifically, the gate of bottom-array noise immunity PMOS transistor 560 is connected to the drain of bottom-array noise immunity PMOS transistor 565 and the gate of bottom-array noise immunity PMOS transistor 565 is connected to the drain of bottom-array noise immunity PMOS transistor 560.

The gate of bottom-array sensing PMOS transistor 570 is connected to bottom-array column select node 540 and the gate of bottom-array sensing PMOS transistor 575 is connected to bottom-array column select node 545. The source of bottom-array sensing PMOS transistor 570 is connected to the voltage supply and the source of bottom-array sensing PMOS transistor 575 is connected to the voltage supply. The drain of bottom-array sensing PMOS transistor 570 is connected to the first inverter gating node and the drain of bottom-array sensing PMOS transistor 575 is connected to the second inverter gating node.

The drain of bottom-array write-data NMOS transistor 580 is connected to bottom-array column select node 540 and the drain of bottom-array write-data NMOS transistor 575 is connected to bottom-array column select node 545. The source of bottom-array write-data NMOS transistor 580 is connected to the ground voltage and the source of bottom-array write-data NMOS transistor 585 is connected to the ground voltage. The gate of bottom-array write-data NMOS transistor 580 is driven by a bottom-array write-data signal and the gate of bottom-array write-data NMOS transistor 585 is driven by a bottom-array write-data complement signal.

Sense latch 495 is shared between top-array column multiplexer 435 and bottom-array column multiplexer 440. Sense latch 495 includes cross-coupled inverters 500 and 505. The source of the PMOS transistor of inverter 500 is connected to the voltage supply and the source of the PMOS transistor of inverter 505 is connected to the voltage supply. The gate of inverter 500 is connected to the first inverter gating node shared by the drain of top-array sensing PMOS transistor 475, the drain of bottom-array sensing PMOS transistor 570, and the diffusion node of inverter 505. The gate of inverter 505 is connected to the second inverter gating node shared by the drain of top-array sensing PMOS transistor 480, the drain of bottom-array sensing PMOS transistor 575, and the diffusion node of inverter 500. The second inverter gating node is fed through buffer or inverter 501 to produce the data output signal.

The drain of the NMOS transistor of inverter 500 is connected to the source of NMOS transistor 520 of NMOS stack 510 and the drain of the NMOS transistor of inverter 505 is connected to the source of NMOS transistor 535 of NMOS stack 515. The gate of NMOS transistor 520 of NMOS stack 510 is connected to top-array column select node 450. The gate of NMOS transistor 530 of NMOS stack 515 is connected to top-array column select node 445. The drain of NMOS transistor 520 is connected to the source of NMOS transistor 525 and the drain of NMOS transistor 530 is connected to the source of NMOS transistor 535. The gate of NMOS transistor 525 of NMOS stack 510 is connected to bottom-array column select node 545. The gate of NMOS transistor 535 of NMOS stack 515 is connected to bottom-array column select node 540. The drain of NMOS transistor 525 is connected to the ground voltage and the drain of NMOS transistor 535 is connected to the ground voltage.

One of ordinary skill in the art, having the benefit of this disclosure, will recognize that the sense amplifier 430 supports both top-array and bottom-array access. Further, one of ordinary skill in the art, having the benefit of this disclosure, will recognize that the operation of the sense amplifier via top-array access is functionally identical to operation of the sense amplifier via bottom-array access. Accordingly, for purposes of illustration only, the operation of the sense amplifier 430 will be described with reference to top-array access only. During the pre-charge phase, top-array pre-charge PMOS transistors 455 and 460 are turned on via the top-array pre-charge signal and the top-array column select nodes 445 and 450 are pre-charged to the voltage supply, $V_{supply}$. Top-array sensing PMOS transistors 475 and 480 are turned off, NMOS transistors 520 and 525 of NMOS stack 510 and NMOS transistors 530 and 535 of NMOS stack 515 are turned on, and the source nodes of the NMOS transistors of inverters 500 and 505 are grounded through NMOS stacks 510 and 515 respectively. As a result, the diffusion nodes of inverters 500 and 505 retain whatever value was stored during the pre-charge phase. The sense latch 495 is now ready to accept a new value on the column select signals during the next read operation.

During a read operation, one of the top-array bit-line signal or the bit-line complement signal cause the voltage at the corresponding one of the top-array column select nodes 445 or 450 to drop below $V_{supply}$, while the other is maintained at the pre-charged level of $V_{supply}$. One of ordinary skill in the art, having the benefit of this disclosure, will recognize that the read operation is symmetrical with respect to whether the voltage drops at either top-array column select nodes 445 or 450. Accordingly, for purposes of illustration only, a read operation will be described where the top-array bit-line signal causes the voltage at top-array column select node 445 to drop below $V_{supply}$, while the voltage at top-array column select node 450 remains at the pre-charge level of $V_{supply}$. As the voltage at top-array column select node 445 drops, top-array sensing PMOS transistor 475 turns on when the voltage at the top-array column select node 445 reaches a threshold voltage $V_t$. Top-array sensing PMOS transistor 475 amplifies the drop in voltage of the top-array bit-line signal to a full-swing voltage level. As a result, the gate of inverter 500 and the diffusion node of inverter 505 are set to a logic high represented by a "1" value and the gate of inverter 505 and the diffusion node of inverter 500 are grounded through NMOS stack 510, corresponding to a logic low represented by a "0" value. The voltage at the diffusion node of inverter 500, a logic low in this example, is presented to the input of inverter 501 as the data output signal.

During a write operation, the top-array write-data signal controls the gate of top-array write-data NMOS transistor 485 and the top-array write-data complement signal controls the gate of top-array write-data NMOS transistor 490. The drain of top-array write-data transistor 485 is connected to top-array column select node 445 and the drain of top-array write-data transistor 490 is connected to top-array column select node 450. The drains of top-array write-data transistors 485 and 490 are used to transfer a write data value at the top-array bit-lines. When one of top-array write-data NMOS transistors 485 or 490 is turned on, the corresponding one of top-array column select nodes 445 or 450 is grounded through the source of write-data NMOS transistor 485 or 490. As a result, one of top-array column select nodes 445 or 450 is logic low while the other remains at the pre-charged level of $V_{supply}$. As a result, one of top-array sensing PMOS transistors 475 or 480, corresponding to the one of top-array column select nodes 445 or 450 that is logic low, is turned on. As a result, the value of the write data is latched in sense latch 495. This allows write data to appear on the read data bus, thus providing write-through functionality without the requirement for additional circuitry.

In one or more embodiments, a processor 210 is comprised of a cache memory. The cache memory is organized as a 386 KB, 24-way, L2 data cache memory and includes a plurality of banks 405, plurality of sub-banks 410, a plurality of panels 415, a plurality of sub-panels 420, a plurality of memory arrays 422, and a plurality of local input/output ("IO") 425. Specifically, each bank 405 is comprised of four sub-banks 410. Each sub-bank 410 is comprised of four panels 415. Each panel 415 is comprised of three sub-panels 420. Each sub-panel 420 is comprised of a pair of memory arrays 422. Each pair of memory arrays 422 includes a top-array and a bottom-array that share a local IO 425. One of ordinary skill in the art will recognize that the organization of the cache memory may be varied in accordance with one or more embodiments of the present invention. Each local IO 425 performs input and output functions with respect to a pair of memory arrays 422. Each local IO 425 includes a plurality of sense amplifiers 430.

The local IO 425 of the processor includes sense amplifier 430 that provides first memory array 422 access and second memory array 422 access and write-through functionality. As such, sense amplifiers 430 can be placed between arrays 422 and reduce the number of sense amplifiers required in a given design. As a result, the physical footprint and the power consumption required by the sense amplifier function is reduced. In addition, this reduces the design complexity and provides for greater process tolerance.

The sense amplifier 430 includes a top-array pre-charge circuit comprised of PMOS transistors 455 and 460 and a bottom-array pre-charge circuit comprised of PMOS transistors 550 and 555. The sense amplifier 430 also includes a top-array keeper circuit comprised of PMOS transistors 465 and 470 and a bottom-array keeper circuit comprised of PMOS transistors 560 and 565. The sense amplifier 430 also includes a sense latch 495 comprised of cross-coupled inverters 500 and 505 and NMOS stacks 510 and 515. The sense amplifier 430 also includes an output inverter 501.

The top-array pre-charge circuit is coupled to the top-array keeper circuit and the sense latch 495 at nodes 445 and 450. The bottom-array pre-charge circuit is coupled to the bottom-array keeper circuit and the sense latch 495 at nodes 540 and 545. The sense latch 495 is coupled to an output inverter 501. The sense amplifier 430 is disposed between a pair of arrays 422. The sense amplifier 430 operates in accordance with the description provided with reference to FIG. 4 above.

Advantages of one or more embodiments of the present invention may include one or more of the following.

In one or more embodiments of the present invention, the process-tolerant, large-swing sense amplifier enables a sensing scheme with improved process tolerance and reduced power consumption in a small and highly efficient footprint.

In one or more embodiments of the present invention, the process-tolerant, large-swing sense amplifier utilizes sensing PMOS transistors to amplify the small-signal column selects. Because the sensing PMOS transistors scale with the process technology, the sense amplifier is process tolerant.

In one or more embodiments of the present invention, the process-tolerant, large-swing sense amplifier reduces device sizes on IO circuits and allows for the breaking down of arrays into smaller arrays. This enables fine grain array gating to reduce power consumption.

In one or more embodiments of the present invention, the process-tolerant, large-swing sense amplifier provides for write-through capability with no additional circuitry.

In one or more embodiments of the present invention, the process-tolerant, large-swing sense amplifier with latching capability improves the write-ability and speed of operation of the sense latch.

In one or more embodiments of the present invention, the process-tolerant, large-swing sense amplifier with latching capability speeds up the development of the bit-line signal by isolating the pre-charge, the sense latch, and other IO-related parasitic capacitance. Once the bit-line signal causes the voltage at the column select node to droop below $V_{th}$ (body-bias adjusted $V_{th}$), the charge sharing effect speeds up the development of the signal on the sensing PMOS transistor. This allows for relaxed timing of a column multiplexer selection signal that is otherwise timing critical.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A sense amplifier comprising:
a top-array multiplexer wherein the top-array multiplexer is configured to input a top-array bit-line signal to a first top-array column select node and to input a top-array bit-line complement signal to a second top-array column select node;
a first top-array pre-charge PMOS transistor wherein a source of the first top-array pre-charge PMOS transistor is connected to a voltage supply, a drain of the first top-array pre-charge PMOS transistor is connected to the first top-array column select node, and a gate of the first top-array pre-charge PMOS transistor is configured to receive a top-array pre-charge signal;
a second top-array pre-charge PMOS transistor wherein a source of the second top-array pre-charge PMOS transistor is connected to the voltage supply, a drain of the second top-array pre-charge PMOS transistor is connected to the second top-array column select node, and a gate of the second top-array pre-charge PMOS transistor is configured to receive the top-array pre-charge signal;
a first top-array write-data NMOS transistor wherein a drain of the first top-array write-data NMOS transistor is connected to the first top-array column select node, a source of the first top-array write-data NMOS transistor is connected to a ground voltage, and a gate of the first top-array write-data NMOS transistor is configured to receive a top-array write-data signal;
a second top-array write-data NMOS transistor wherein a drain of the second top-array write-data NMOS transistor is connected to the second top-array column select node, a source of the second top-array write-data NMOS transistor is connected to the ground voltage, and a gate of the second top-array write-data NMOS transistor is configured to receive a top-array write-data complement signal;
a first top-array sensing PMOS transistor wherein a source of the first top-array sensing PMOS transistor is connected to the voltage supply, a drain of the first top-array sensing PMOS transistor is connected to a first inverter gating node, and a gate of the first top-array sensing PMOS transistor is connected to the first top-array column select node;
a second top-array sensing PMOS transistor wherein a source of the second top-array sensing PMOS transistor is connected to the voltage supply, a drain of the second top-array sensing PMOS transistor is connected to a second inverter gating node, and a gate of the second top-array sensing PMOS transistor is connected to the second top-array column select node;
a sense latch comprising:
a first inverter comprised of a PMOS transistor and an NMOS transistor,
wherein a source of the PMOS transistor is connected to the voltage supply, a drain of the PMOS transistor is connected to a source of the NMOS transistor and the second inverter gating node, and a gate of the PMOS transistor is connected to the first inverter gating node, and
wherein a drain of the NMOS transistor is connected a source of a first NMOS transistor of a first NMOS transistor stack, and a gate of the NMOS transistor is connected to the first inverter gating node;
a second inverter comprised of a PMOS transistor and an NMOS transistor,
wherein a source of the PMOS transistor is connected to the voltage supply, a drain of the PMOS transistor is connected to a source of the NMOS transistor and the first inverter gating node, and a gate of the PMOS transistor is connected to the first inverter gating node, and wherein a drain of the NMOS transistor is connected a drain of a first NMOS transistor of a second NMOS transistor stack, and a gate of the NMOS transistor is connected to the second inverter gating node;

the first NMOS stack comprises the first NMOS transistor and a second NMOS transistor, wherein a drain of the first NMOS transistor is connected to a source of the second NMOS transistor, and a gate of the first NMOS transistor is connected to the second top-array column select node, and wherein a drain of the second NMOS transistor is connected to the ground voltage, a gate of the second NMOS transistor is connected to a second bottom-array column select node, the second NMOS stack comprises the first NMOS transistor and a second NMOS transistor, wherein a drain of the first NMOS transistor is connected to a source of the second NMOS transistor, and a gate of the first NMOS transistor is connected to the first top-array column select node, and wherein a drain of the second NMOS transistor is connected to the ground voltage, a gate of the second NMOS transistor is connected to a first bottom-array column select node;

a bottom-array multiplexer wherein the bottom-array multiplexer is configured to input a bottom-array bit-line signal to a first bottom-array column select node and to input a bottom-array bit-line complement signal to a second bottom-array column select node;

a first bottom-array pre-charge PMOS transistor wherein a source of the first bottom-array pre-charge PMOS transistor is connected to the voltage supply, a drain of the first bottom-array pre-charge PMOS transistor is connected to the first bottom-array column select node, and a gate of the first bottom-array pre-charge PMOS transistor is configured to receive a bottom-array pre-charge signal;

a second bottom-array pre-charge PMOS transistor wherein a source of the second bottom-array pre-charge PMOS transistor is connected to the voltage supply, a drain of the second bottom-array pre-charge PMOS transistor is connected to the second bottom-array column select node, and a gate of the second bottom-array pre-charge PMOS transistor is configured to receive the bottom-array pre-charge signal;

a first bottom-array write-data NMOS transistor wherein a drain of the first bottom-array write-data NMOS transistor is connected to the first bottom-array column select node, a source of the first bottom-array write-data NMOS transistor is connected to a ground voltage, and a gate of the first bottom-array write-data NMOS transistor is configured to receive a bottom-array write-data signal;

a second bottom-array write-data NMOS transistor wherein a drain of the second bottom-array write-data NMOS transistor is connected to the second bottom-array column select node, a source of the second bottom-array write-data NMOS transistor is connected to the ground voltage, and a gate of the second bottom-array write-data NMOS transistor is configured to receive a bottom-array write-data complement signal;

a first bottom-array sensing PMOS transistor wherein a source of the first bottom-array sensing PMOS transistor is connected to the voltage supply, a drain of the first bottom-array sensing PMOS transistor is connected to the first inverter gating node, and a gate of the first bottom-array sensing PMOS transistor is connected to the first bottom-array column select node; and a second bottom-array sensing PMOS transistor wherein a source of the second bottom-array sensing PMOS transistor is connected to the voltage supply, a drain of the second top-array sensing PMOS transistor is connected to the second inverter gating node, and a gate of the second bottom-array sensing PMOS transistor is connected to the second bottom-array column select node;

wherein the second inverter gating node is configured to output the data value stored in the sense latch.

2. The sense amplifier of claim 1, further comprising:

a first top-array noise-immunity PMOS transistor and a second top-array noise-immunity PMOS transistor, wherein a source of the first top-array noise immunity PMOS transistor is connected to the voltage supply and a source of the second top-array noise immunity PMOS transistor is connected to the voltage supply, wherein a drain of the first top-array noise-immunity PMOS transistor is connected to the first top-array column select node and a drain of the second top-array noise immunity PMOS transistor is connected to the second top-array column select node, and wherein a gate of the first top-array noise-immunity PMOS transistor is connected to the second top-array column-select node and a gate of the second top-array noise-immunity PMOS transistor is connected to the first top-array column select node.

3. The sense amplifier of claim 1, further comprising:

a first bottom-array noise-immunity PMOS transistor and a second bottom-array noise-immunity PMOS transistor, wherein a source of the first bottom-array noise immunity PMOS transistor is connected to the voltage supply and a source of the second bottom-array noise immunity PMOS transistor is connected to the voltage supply, wherein a drain of the first bottom-array noise-immunity PMOS transistor is connected to the first bottom-array column select node and a drain of the second bottom-array noise immunity PMOS transistor is connected to the second bottom-array column select node, and wherein a gate of the first bottom-array noise-immunity PMOS transistor is connected to the second bottom-array column-select node and a gate of the second top-array noise-immunity PMOS transistor is connected to the first top-array column select node.

4. A processor comprising:

a processor core coupled to a cache memory, wherein the cache memory comprises a plurality of sense amplifiers, wherein each sense amplifier comprises:

a top-array multiplexer wherein the top-array multiplexer is configured to input a top-array bit-line signal to a first top-array column select node and to input a top-array bit-line complement signal to a second top-array column select node, a first top-array pre-charge PMOS transistor wherein a source of the first top-array pre-charge PMOS transistor is connected to a voltage supply, a drain of the first top-array pre-charge PMOS transistor is connected to the first top-array column select node, and a gate of the first top-array pre-charge PMOS transistor is configured to receive a top-array pre-charge signal, a second top-array pre-charge PMOS transistor wherein a source of the second top-array pre-charge PMOS transistor is connected to the voltage supply, a drain of the second top-array pre-charge PMOS transistor is connected to the second top-array column select node, and a gate of the second top-array pre-charge PMOS transistor is configured to receive the top-array pre-charge signal, a first top-array write-data NMOS transistor wherein a drain of the first top-array write-data NMOS transistor is connected to the first top-array column select node, a source of the first top-array write-data NMOS transistor is connected to a ground voltage, and a gate of the first top-array write-data NMOS transistor is configured to receive a top-array write-data signal, a second top-array write-data NMOS transistor wherein a drain of the secondtop-array write-data NMOS transistor is connected to the second top-array column select node, a source of the second top-array write-data NMOS transistor is connected to the ground voltage, and a gate of the second top-array write-data NMOS transistor is configured to receive a top-array write-data complement signal, a first top-array sensing PMOS transistor wherein a source of the first top-array sensing PMOS transistor is connected to the voltage supply, a drain of the first top-array sensing PMOS transistor is connected to a first inverter gating node, and a gate of the first top-array sensing PMOS transistor is connected to the first top-array column select node, a second top-array sensing PMOS transistor wherein a source of the second top-array sensing PMOS transistor is connected to the voltage supply, a drain of the second top-array sensing PMOS transistor is connected to a second inverter gating node, and a gate of the second top-array sensing PMOS transistor is connected to the second top-array column select node, a sense latch comprising:

a first inverter comprised of a PMOS transistor and an NMOS transistor, wherein a source of the PMOS transistor is connected to the voltage supply, a drain of the PMOS transistor is connected to a source of the NMOS transistor and the second inverter gating node, and a gate of the PMOS transistor is connected to the first inverter gating node, and wherein a drain of the NMOS transistor is connected a source of a first NMOS transistor of a first NMOS transistor stack, and a gate of the NMOS transistor is connected to the first inverter gating node, a second inverter comprised of a PMOS transistor and an NMOS transistor, wherein a source of the PMOS transistor is connected to the voltage supply, a drain of the PMOS transistor is connected to a source of the NMOS transistor and the first inverter gating node, and a gate of the PMOS transistor is connected to the first inverter gating node, and wherein a drain of the NMOS transistor is connected a drain of a first NMOS transistor of a second NMOS transistor stack, and a gate of the NMOS transistor is connected to the second inverter gating node, the first NMOS stack comprises the first NMOS transistor and a second NMOS transistor, wherein a drain of the first NMOS transistor is connected to a source of the second NMOS transistor, and a gate of the first NMOS transistor is connected to the second top-array column select node, and wherein a drain of the second NMOS transistor is connected to the ground voltage, a gate of the second NMOS transistor is connected to a second bottom-array column select node, the second NMOS stack comprises the first NMOS transistor and a second NMOS transistor, wherein a drain of the first NMOS transistor is connected to a source of the second NMOS transistor, and a gate of the first NMOS transistor is connected to the first top-array column select node, and wherein a drain of the second NMOS transistor is connected to the ground voltage, a gate of the second NMOS transistor is connected to a first bottom-array column select node, a bottom-array multiplexer wherein the bottom-array multiplexer is configured to input a bottom-array bit-line signal to a first bottom-array column select node and to input a bottom-array bit-line complement signal to a second bottom-array column select node, a first bottom-array pre-charge PMOS transistor wherein a source of the first bottom-array pre-charge PMOS transistor is connected to the voltage supply, a drain of the first bottom-array pre-charge PMOS transistor is connected to the first bottom-array column select node, and a gate of the first bottom-array pre-charge PMOS transistor is configured to receive a bottom-array pre-charge signal, a second bottom-array pre-charge PMOS transistor wherein a source of the second bottom-array pre-charge PMOS transistor is connected to the voltage supply, a drain of the second bottom-array pre-charge PMOS transistor is connected to the second bottom-array column select node, and a gate of the second bottom-array pre-charge PMOS transistor is configured to receive the bottom-array pre-charge signal, a first bottom-array write-data NMOS transistor wherein a drain of the first bottom-array write-data NMOS transistor is connected to the first bottom-array column select node, a source of the first bottom-array write-data NMOS transistor is connected to a ground voltage, and a gate of the first bottom-array write-data NMOS transistor is configured to receive a bottom-array write-data signal, a second bottom-array write-data NMOS transistor wherein a drain of the second bottom-array write-data NMOS transistor is connected to the second bottom-array column select node, a source of the second bottom-array write-data NMOS transistor is connected to the ground voltage, and a gate of the second bottom-array write-data NMOS transistor is configured to receive a bottom-array write-data complement signal, a first bottom-array sensing PMOS transistor wherein a source of the first bottom-array sensing PMOS transistor is connected to the voltage supply, a drain of the first bottom-array sensing PMOS transistor is connected to the first inverter gating node, and a gate of the first bottom-array sensing PMOS transistor is connected to the first bottom-array column select node, and a second bottom-array sensing PMOS transistor wherein a source of the second bottom-array sensing PMOS transistor is connected to the voltage supply, a drain of the second top-array sensing PMOS transistor is connected to the second inverter gating node, and a gate of the second bottom-array sensing PMOS transistor is connected to the second bottom-array column select node, and wherein the second inverter gating node is configured to output the data value stored in the sense latch.

5. The processor of claim 4, the sense amplifier further comprising:

a first top-array noise-immunity PMOS transistor and a second top-array noise-immunity PMOS transistor, wherein a source of the first top-array noise immunity PMOS transistor is connected to the voltage supply and a source of the second top-array noise immunity PMOS transistor is connected to the voltage supply, wherein a drain of the first top-array noise-immunity PMOS transistor is connected to the first top-array column select node and a drain of the second top-array noise immunity PMOS transistor is connected to the second top-array column select node, and wherein a gate of the first top-array noise-immunity PMOS transistor is connected to the second top-array column-select node and a gate of the second top-array noise-immunity PMOS transistor is connected to the first top-array column select node.

6. The processor of claim 4, the sense amplifier further comprising:

a first bottom-array noise-immunity PMOS transistor and a second bottom-array noise-immunity PMOS transistor, wherein a source of the first bottom-array noise immunity PMOS transistor is connected to the voltage supply and a source of the second bottom-array noise immunity PMOS transistor is connected to the voltage supply, wherein a drain of the first bottom-array noise-immunity PMOS transistor is connected to the first bottom-array column select node and a drain of the second bottom-array noise immunity PMOS transistor is connected to the second bottom-array column select node, and wherein a gate of the first bottom-array noise-immunity PMOS transistor is connected to the second bottom-array column-select node and a gate of the second top-array noise-immunity PMOS transistor is connected to the first top-array column select node.

7. A system comprising:
an input device;
an output device;
a printed circuit board; and
a processor disposed on the printed circuit board,
wherein the processor is coupled to a cache memory,
wherein the cache memory comprises a plurality of sense amplifiers,
wherein each sense amplifier comprises:

a top-array multiplexer wherein the top-array multiplexer is configured to input a top-array bit-line signal to a first top-array column select node and to input a top-array bit-line complement signal to a second top-array column select node, a first top-array pre-charge PMOS transistor wherein a source of the first top-array pre-charge PMOS transistor is connected to a voltage supply, a drain of the first top-array pre-charge PMOS transistor is connected to the first top-array column select node, and a gate of the first top-array pre-charge PMOS transistor is configured to receive a top-array pre-charge signal, a second top-array pre-charge PMOS transistor wherein a source of the second top-array pre-charge PMOS transistor is connected to the voltage supply, a drain of the second top-array pre-charge PMOS transistor is connected to the second top-array column select node, and a gate of the second top-array pre-charge PMOS transistor is configured to receive the top-array pre-charge signal, a first top-array write-data NMOS transistor wherein a drain of the first top-array write-data NMOS transistor is connected to the first top-array column select node, a source of the first top-array write-data NMOS transistor is connected to a ground voltage, and a gate of the first top-array write-data NMOS transistor is configured to receive a top-array write-data signal, a second top-array write-data NMOS transistor wherein a drain of the second top-array write-data NMOS transistor is connected to the second top-array column select node, a source of the second top-array write-data NMOS transistor is connected to the ground voltage, and a gate of the second top-array write-data NMOS transistor is configured to receive a top-array write-data complement signal, a first top-array sensing PMOS transistor wherein a source of the first top-array sensing PMOS transistor is connected to the voltage supply, a drain of the first top-array sensing PMOS transistor is connected to a first inverter gating node, and a gate of the first top-array sensing PMOS transistor is connected to the first top-array column select node, a second top-array sensing PMOS transistor wherein a source of the second top-array sensing PMOS transistor is connected to the voltage supply, a drain of the second top-array sensing PMOS transistor is connected to a second inverter gating node, and a gate of the second top-array sensing PMOS transistor is connected to the second top-array column select node, a sense latch comprising:
a first inverter comprised of a PMOS transistor and an NMOS transistor,
wherein a source of the PMOS transistor is connected to the voltage supply, a drain of the PMOS transistor is connected to a source of the NMOS transistor and the second inverter gating node, and a gate of the PMOS transistor is connected to the first inverter gating node, and wherein a drain of the NMOS transistor is connected a source of a first NMOS transistor of a first NMOS transistor stack, and a gate of the NMOS transistor is connected to the first inverter gating node, a second inverter comprised of a PMOS transistor and an NMOS transistor,
wherein a source of the PMOS transistor is connected to the voltage supply, a drain of the PMOS transistor is connected to a source of the NMOS transistor and the first inverter gating node, and a gate of the PMOS transistor is connected to the first inverter gating node, and wherein a drain of the NMOS transistor is connected a drain of a first NMOS transistor of a second NMOS transistor stack, and a gate of the NMOS transistor is connected to the second inverter gating node, the first NMOS stack comprises the first NMOS transistor and a second NMOS transistor,
wherein a drain of the first NMOS transistor is connected to a source of the second NMOS transistor, and a gate of the first NMOS transistor is connected to the second top-array column select node, and wherein a drain of the second NMOS transistor is connected to the ground voltage, a gate of the second NMOS transistor is connected to a second bottom-array column select node, the second NMOS stack comprises the first NMOS transistor and a second NMOS transistor,
wherein a drain of the first NMOS transistor is connected to a source of the second NMOS transistor, and a gate of the first NMOS transistor is connected to the first top-array column select node, and wherein a drain of the second NMOS transistor is connected to the ground voltage, a gate of the second NMOS transistor is connected to a first bottom-array column select node, a bottom-array multiplexer wherein the bottom-array multiplexer is configured to input a bottom-array bit-line signal to a first bottom-array column select node and to input a bottom-array bit-line complement signal to a second bottom-array column select node, a first bottom-array pre-charge PMOS transistor wherein a source of the first bottom-array pre-charge PMOS transistor is connected to the voltage supply, a drain of the first bottom-array pre-charge PMOS transistor is connected to the first bottom-array column select node, and a gate of the first bottom-array pre-charge PMOS transistor is configured to receive a bottom-array pre-charge signal, a second bottom-array pre-charge PMOS transistor wherein a source of the second bottom-array pre-charge PMOS transistor is connected to the voltage supply, a drain of the second bottom-array pre-charge PMOS transistor is connected to the second bottom-array column select node, and a gate of the second bottom-array pre-charge PMOS transistor is configured to receive the bottom-array pre-charge signal, a first bottom-array write-data NMOS transistor wherein a drain of the first bottom-array write-data NMOS transistor is connected to the first bottom-array column select node, a source of the first bottom-array write-data NMOS transistor is connected to a ground voltage, and a gate of the first bottom-array write-data NMOS transistor is configured to receive a bottom-array write-data signal, a second bottom-array write-data NMOS transistor wherein a drain of the second bottom-array write-data NMOS transistor is connected to the second bottom-array column select node, a source of the second bottom-array write-data NMOS transistor is connected to the ground voltage, and a gate of the second bottom-array write-data NMOS transistor is configured to receive a bottom-array write-data complement signal, a first bottom-array sensing PMOS transistor wherein a source of the first bottom-array sensing PMOS transistor is connected to the voltage supply, a drain of the first bottom-array sensing PMOS transistor is connected to the first inverter gating node, and a gate of the first bottom-array sensing PMOS transistor is connected to the first bottom-array column select node, and a second bottom-array sensing PMOS transistor wherein a source of the second bottom-array sensing PMOS transistor is connected to the voltage supply, a drain of the second top-array sensing PMOS transistor is connected to the second inverter gating node, and a gate of the second bottom-array sensing PMOS transistor is connected to the second bottom-array column select node, and wherein the second inverter gating node is configured to output the data value stored in the sense latch.

8. The system of claim 7, the sense amplifier further comprising:

a first top-array noise-immunity PMOS transistor and a second top-array noise-immunity PMOS transistor, wherein a source of the first top-array noise immunity PMOS transistor is connected to the voltage supply and a source of the second top-array noise immunity PMOS transistor is connected to the voltage supply, wherein a drain of the first top-array noise-immunity PMOS transistor is connected to the first top-array column select node and a drain of the second top-array noise immunity PMOS transistor is connected to the second top-array column select node, and wherein a gate of the first top-array noise-immunity PMOS transistor is connected to the second top-array column-select node and a gate of the second top-array noise-immunity PMOS transistor is connected to the first top-array column select node.

9. The system of claim 7, the sense amplifier further comprising:

a first bottom-array noise-immunity PMOS transistor and a second bottom-array noise-immunity PMOS transistor, wherein a source of the first bottom-array noise immunity PMOS transistor is connected to the voltage supply and a source of the second bottom-array noise immunity PMOS transistor is connected to the voltage supply, wherein a drain of the first bottom-array noise-immunity PMOS transistor is connected to the first bottom-array column select node and a drain of the second bottom-array noise immunity PMOS transistor is connected to the second bottom-array column select node, and wherein a gate of the first bottom-array noise-immunity PMOS transistor is connected to the second bottom-array column-select node and a gate of the second top-array noise-immunity PMOS transistor is connected to the first top-array column select node.

10. A processor comprising:

a first memory array;

a second memory array; and a sense amplifier disposed between the first memory array and the second memory array, wherein the sense amplifier comprises:

a top-array pre-charge circuit, a bottom-array pre-charge circuit, a top-array keeper circuit, a bottom-array keeper circuit, a sense latch, and an output buffer, and wherein the top-array pre-charge circuit is coupled to the top-array keeper circuit and the sense latch at a pair of top-array common nodes, wherein the bottom-array pre-charge circuit is coupled to the bottom-array keeper circuit and the sense latch at a pair of bottom-array common nodes, wherein the sense latch is coupled to the output buffer at a common node, and wherein the sense amplifier is configured to amplify the signals of both the first memory array and the second memory array wherein the sense latch comprises a pair of cross-coupled inverters and a pair of NMOS stacks.

11. The processor of claim 10, wherein the top-array pre-charge circuit comprises a pair of pre-charge PMOS transistors configured for use with the first memory array.

12. The processor of claim 10, wherein the bottom-array pre-charge circuit comprises a pair of pre-charge PMOS transistors configured for use with the second memory array.

13. The processor of claim 10, wherein the top-array keeper circuit comprises a pair of PMOS transistors configured for use with the first memory array.

14. The processor of claim 10, wherein the bottom-array keeper circuit comprises a pair of PMOS transistors configured for use with the second memory array.

15. The processor of claim 10, wherein the pair of cross-coupled inverters comprises a first inverter and a second inverter, wherein the pair of NMOS stacks comprises a first NMOS transistor stack and a second NMOS transistor stack, wherein the first inverter is comprised of a PMOS transistor and an NMOS transistor, wherein a source of the PMOS transistor is connected to the voltage supply, a drain of the PMOS transistor is connected to a source of the NMOS transistor and a second inverter gating node, and a gate of the PMOS transistor is connected to a first inverter gating node, and wherein a drain of the NMOS transistor is connected a source of a first NMOS transistor of the first NMOS transistor stack, and a gate of the NMOS transistor is connected to the first inverter gating node.

wherein the second inverter comprised of a PMOS transistor and an NMOS transistor, wherein a source of the PMOS transistor is connected to the voltage supply, a drain of the PMOS transistor is connected to a source of the NMOS transistor and the first inverter gating node, and a gate of the PMOS transistor is connected to the first inverter gating node, and wherein a drain of the NMOS transistor is connected a drain of a first NMOS transistor of the second NMOS transistor stack, and a gate of the NMOS transistor is connected to the second inverter gating node.

16. The processor of claim 15, wherein the first NMOS stack comprises the first NMOS transistor and a second NMOS transistor, wherein a drain of the first NMOS transistor is connected to a source of the second NMOS transistor, and a gate of the first NMOS transistor is connected to a second top-array column select node, and wherein a drain of the second NMOS transistor is connected to the ground voltage, a gate of the second NMOS transistor is connected to a second bottom-array column select node, wherein the second NMOS stack comprises the first NMOS transistor and a second NMOS transistor, wherein a drain of the first NMOS transistor is connected to a source of the second NMOS transistor, and a gate of the first NMOS transistor is connected to a first top-array column select node, and wherein a drain of the second NMOS transistor is connected to the ground voltage, a gate of the second NMOS transistor is connected to a first bottom-array column select node.

17. The processor of claim 15, the sense latch further comprising:

a first top-array noise-immunity PMOS transistor and a second top-array noise-immunity PMOS transistor, wherein a source of the first top-array noise immunity PMOS transistor is connected to the voltage supply and a source of the second top-array noise immunity PMOS transistor is connected to the voltage supply, wherein a drain of the first top-array noise-immunity PMOS transistor is connected to the first top-array column select node and a drain of the second top-array noise immunity PMOS transistor is connected to the second top-array column select node, and wherein a gate of the first top-array noise-immunity PMOS transistor is connected to the second top-array column-select node and a gate of the second top-array noise-immunity PMOS transistor is connected to the first top-array column select node.

18. The processor of claim 10, wherein the pair of NMOS stacks are coupled to the top-array common nodes and the bottom-array common nodes.

19. The processor of claim 10, wherein the output buffer comprises an output inverter.

* * * * *

UNITED STATES PATENT AND TRADEMARK OFFICE
CERTIFICATE OF CORRECTION

PATENT NO. : 8,446,791 B2  
APPLICATION NO. : 12/960047  
DATED : May 21, 2013  
INVENTOR(S) : Pham et al.

Page 1 of 2

It is certified that error appears in the above-identified patent and that said Letters Patent is hereby corrected as shown below:

On Title page, item (54) and in the specification, column 1, under "Title", line 2, delete "AMPLFIER" and insert -- AMPLIFIER --, therefor.

In the Specification:
In column 2, line 15, after "connected" insert - - to - -.

In column 2, line 24, after "connected" insert - - to - -.

In column 4, line 15, after "connected" insert - - to - -.

In column 4, line 24, after "connected" insert - - to - -.

In column 6, line 17, after "connected" insert - - to - -.

In column 6, line 26, after "connected" insert - - to - -.

In column 13, line 55, delete "droop" and insert - - drop - -, therefor.

In the Claims:
In column 14, line 59, in Claim 1, after "connected" insert - - to - -.

In column 15, line 3, in Claim 1, after "connected" insert - - to - -.

In column 17, line 12, in Claim 4, delete "secondtop" and insert - - second top - -, therefor.

In column 17, line 41, in Claim 4, after "connected" insert - - to - -..

In column 17, line 52, in Claim 4, after "connected" insert - - to - -.

In column 20, line 31, in Claim 7, after "connected" insert - - to - -.

In column 20, line 42, in Claim 7, after "connected" insert - - to - -.

Signed and Sealed this  
Tenth Day of September, 2013

Teresa Stanek Rea  
*Acting Director of the United States Patent and Trademark Office*

CERTIFICATE OF CORRECTION (continued)
U.S. Pat. No. 8,446,791 B2

In column 23, line 4, in Claim 15, after "connected" insert - - to - -.

In column 23, line 7, in Claim 15, delete "node." and insert - - node, - -, therefor.

In column 23, line 15, in Claim 15, after "connected" insert - - to - -.